(12) United States Patent
Xanthopoulos et al.

(10) Patent No.: US 11,545,981 B1
(45) Date of Patent: Jan. 3, 2023

(54) DLL-BASED CLOCKING ARCHITECTURE WITH PROGRAMMABLE DELAY AT PHASE DETECTOR INPUTS

(71) Applicant: MARVELL ASIA PTE, LTD., Singapore (SG)

(72) Inventors: Thucydides Xanthopoulos, Watertown, MA (US); Nitin Mohan, Northborough, MA (US)

(73) Assignee: MARVELL ASIA PTE, LTD., Singapore (SG)

( * ) Notice: Subject to any disclaimer, the term of this patent is extended or adjusted under 35 U.S.C. 154(b) by 238 days.

(21) Appl. No.: 16/528,311

(22) Filed: Jul. 31, 2019

Related U.S. Application Data

(60) Provisional application No. 62/786,777, filed on Dec. 31, 2018.

(51) Int. Cl.
*H03L 7/08* (2006.01)
*H03L 7/081* (2006.01)
*G06F 1/324* (2019.01)
*G06F 1/10* (2006.01)
*H03L 7/07* (2006.01)

(52) U.S. Cl.
CPC .............. *H03L 7/0816* (2013.01); *G06F 1/10* (2013.01); *G06F 1/324* (2013.01); *H03L 7/07* (2013.01); *H03L 7/0818* (2013.01)

(58) Field of Classification Search
CPC ... H03L 7/0814; H03L 7/0812; H03L 7/0805; H03L 7/087; G11C 7/222
USPC ........................................................ 327/158
See application file for complete search history.

(56) References Cited

U.S. PATENT DOCUMENTS

| | | |
|---|---|---|
| 6,285,230 B1 * | 9/2001 | Na .......................... H03K 5/133 327/143 |
| 6,600,345 B1 | 7/2003 | Boutaud |
| 6,686,785 B2 | 2/2004 | Liu et al. |
| 7,145,831 B2 | 12/2006 | Goller et al. |
| 7,551,909 B1 | 6/2009 | Moon et al. |
| 7,764,095 B2 | 7/2010 | Werner et al. |
| 7,952,404 B2 * | 5/2011 | Petrie ......................... H03L 7/07 327/149 |

(Continued)

OTHER PUBLICATIONS

Senger, et al., "Low-Latency, HDL-Synthesizable Dynamic Clock Frequency Controller with Self-Referenced Hybrid Clocking," IEEE, ISCAS 2006.

(Continued)

*Primary Examiner* — Quan Tra
(74) *Attorney, Agent, or Firm* — Hamilton, Brook, Smith & Reynolds, P.C.

(57) ABSTRACT

A delay-locked loop (DLL) and corresponding method improve frequency of a chip. The DLL comprises a first programmable delay element configured to output a first clock, a second programmable delay element configured to output a second clock a phase detector. The phase detector includes a first clock input and a second clock input. The first and second programmable delay elements are further configured, in combination, to introduce a controllable skew between the first and second clocks. The DLL is configured to input the first and second clocks to the first and second clock inputs of the phase detector, respectively. The controllable skew is configured to improve the frequency of the chip.

20 Claims, 6 Drawing Sheets

(56) References Cited

U.S. PATENT DOCUMENTS

| | | | |
|---|---|---|---|
| 7,971,088 B2* | 6/2011 | Jung | G06F 1/10 |
| | | | 713/401 |
| 9,425,779 B2* | 8/2016 | Jung | H03K 5/14 |
| 9,654,121 B1 | 5/2017 | Chu | |
| 10,162,373 B1 | 12/2018 | Chong et al. | |
| 10,530,370 B1 | 1/2020 | Mohan et al. | |
| 10,784,871 B1 | 9/2020 | Xanthopoulos et al. | |
| 10,784,874 B1 | 9/2020 | Bang et al. | |
| 11,402,413 B1 | 8/2022 | Mohan et al. | |
| 2002/0079937 A1 | 6/2002 | Xanthopoulos | |
| 2002/0097592 A1* | 7/2002 | Komurasaki | H03D 3/06 |
| | | | 363/157 |
| 2004/0017234 A1 | 1/2004 | Tam et al. | |
| 2007/0170967 A1* | 7/2007 | Bae | H03K 5/15013 |
| | | | 327/233 |
| 2007/0194815 A1* | 8/2007 | Nelson | H03K 19/00323 |
| | | | 327/112 |
| 2012/0068748 A1 | 3/2012 | Stojanovic et al. | |
| 2013/0238309 A1 | 9/2013 | Ting et al. | |
| 2014/0195081 A1 | 7/2014 | Kwak et al. | |
| 2014/0327478 A1 | 11/2014 | Horng et al. | |
| 2014/0347107 A1 | 11/2014 | Kim | |
| 2015/0162921 A1 | 6/2015 | Chen et al. | |
| 2015/0213873 A1 | 7/2015 | Joo et al. | |
| 2015/0277393 A1 | 10/2015 | Liu et al. | |
| 2015/0326231 A1 | 11/2015 | Thinakaran | |
| 2016/0013796 A1 | 1/2016 | Choi | |
| 2016/0077572 A1 | 3/2016 | Chang | |
| 2016/0351269 A1 | 12/2016 | Okuno et al. | |
| 2018/0351770 A1* | 12/2018 | Chiu | H04L 7/0041 |
| 2019/0007055 A1 | 1/2019 | Nelson | |
| 2020/0044657 A1 | 2/2020 | Pi et al. | |
| 2020/0076439 A1 | 3/2020 | Weeks et al. | |
| 2020/0076440 A1 | 3/2020 | Ng et al. | |
| 2020/0083891 A1 | 3/2020 | Huh et al. | |

OTHER PUBLICATIONS

Sidiropoulos, et al., "A Semidigital Dual Delay-Locked Loop," IEEE Journal of Solid-State Circuits, vol. 32, No. 11, Nov. 1997.
Zoni, et al., "A DVFS Cycle Accurate Simulation Framework with Asynchronous NoC Design for Power-Performance Optimizations," J. Sign. Process Syst., published online Mar. 24, 2015.
U.S. Appl. No. 16/709,367, entitled "Traversing a Variable Delay Line in a Deterministic Number of Clock Cycles," filed on Dec. 10, 2019.
U.S. Appl. No. 16/704,483, entitled "Droop Detection and Mitigation," filed on Dec. 5, 2019.

* cited by examiner

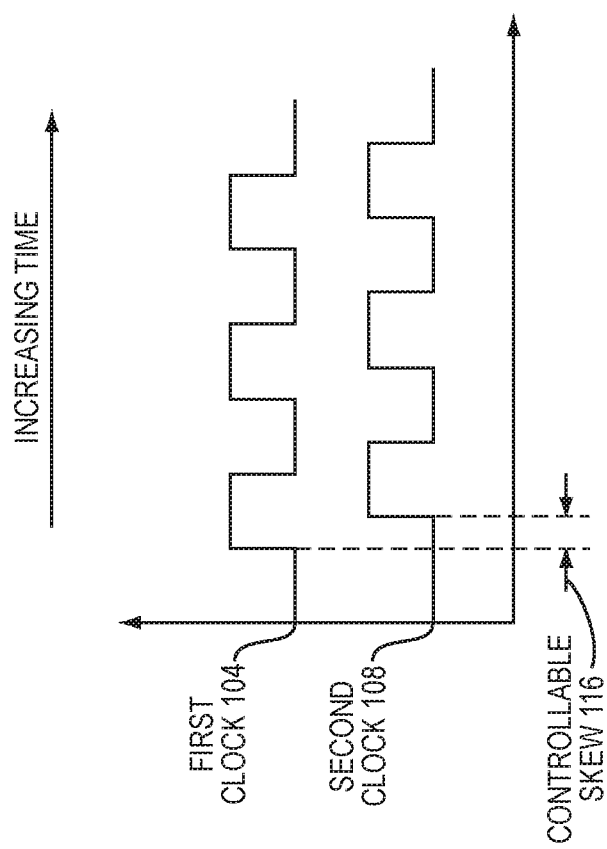

DLL-BASED CLOCKING ARCHITECTURE WITH PROGRAMMABLE DELAY AT PHASE DETECTOR INPUTS

RELATED APPLICATION

This application claims the benefit of U.S. Provisional Application No. 62/786,777, filed on Dec. 31, 2018. The entire teachings of the above application are incorporated herein by reference.

BACKGROUND

As a clock signal is propagated to various parts and components of an Integrated Circuit (IC), also referred to interchangeably herein as a chip, one or more types of system variations may alter a behavior of and/or integrity of the clock signal. Common system variations include, but are not limited to, power variations, temperature variations, and process variations. Due to these and other variations across the chip, a particular clock signal may arrive at different parts of the chip at different times. This difference in arrival of a clock signal at different system components is referred to and known in the art as "clock skew."

Some clocking architectures employ delay-locked loops (DLLs) to account for clock skew. A delay-locked loop (DLL) is a digital circuit similar to a phase-locked loop (PLL), with the main difference being the absence of a voltage controlled oscillator (VCO), replaced by a delay line. In a delay-locked loop (DLL)-based clocking architecture, a phase detector is used to compare a phase difference between two clocks.

The phase difference, that is, the phase detector output, is used to provide feedback to control a respective delay-line within a clock distribution. Using this feedback loop, a DLL corrects for static skew, such as skew introduced by intra-die variations, relative location of the phase-detector, etc., between the two clocks, as well as dynamic skew, such as skew due to dynamic IR drop, dynamic voltage and frequency scaling (DVFS), di/dt (i.e., rate of current change) drop, power-supply noise, etc., between the two clocks.

SUMMARY

According to an example embodiment, a delay-locked loop (DLL) on a chip may comprise a first programmable delay element configured to output a first clock, a second programmable delay element configured to output a second clock, and a phase detector. The phase detector may include a first clock input and a second clock input. The first and second programmable delay elements may be further configured, in combination, to introduce a controllable skew between the first and second clocks. The DLL may be configured to input the first and second clocks to the first and second clock inputs of the phase detector, respectively. The controllable skew may be configured to improve frequency of the chip.

The chip may include at least one critical path and at least one non-critical path. The controllable skew may be configured to improve frequency of the chip by reducing latency of the at least one critical path and increasing latency of the at least one non-critical path.

Respective programmable delays of the first and second programmable delay elements may be configured to be programmed via control signals generated external to the DLL.

The first and second programmable delay elements may be Joint Test Action Group (JTAG) enabled and may include respective JTAG interfaces. Respective programmable delays of the first and second programmable delay elements may be configured to be programmed via the respective JTAG interfaces.

Respective programmable delays of the first and second programmable delay elements may be configured to be programmed via at least one Chip Select Register (CSR) of the chip.

The phase detector may be configured to compare respective phases of the first and second clocks and to generate a phase difference based on the respective phases compared. The DLL may further comprise a fixed delay element; a variable delay element; a first clock distribution circuit interposed between the fixed delay element and the first programmable delay element; a second clock distribution circuit interposed between the variable delay element and the second programmable delay element; and a finite state machine (FSM). The FSM may be configured to generate a delay control based on the phase difference. A variable delay of the variable delay element may be configured to be controlled via the delay control.

The DLL may be coupled to a clock generator. The clock generator may be configured to output a root clock (RCLK) to the fixed and variable delay elements. The fixed delay element may be configured to output a first delayed RCLK to the first clock distribution circuit. The first clock distribution circuit may be configured to output a reference RCLK to the first programmable delay element. The variable delay element may be configured to output a second delayed RCLK to the second clock distribution circuit as a function of the delay control. The second distribution circuit may be configured to output a controlled RCLK to the second programmable delay element.

The first and second programmable delay elements may be further configured, in combination, to introduce the controllable skew to offset a systematic skew between the reference RCLK and the controlled RCLK. The systematic skew may be due to clock distribution differences of the first and second clock distribution circuits.

The fixed delay element may be an input clock fixed delay element and the DLL may further comprise: a first internal fixed delay element configured to delay the first clock and output the first clock delayed; a second internal fixed delay element configured to delay the second clock and output the second clock delayed; a falling phase detector (PDL) configured to generate a PDL output as a function of the first clock and the second clock delayed, wherein the PDL output is input to the FSM; and a rising phase detector (PDR) configured to generate a PDR output as a function of the second clock and the first clock delayed, wherein the PDR output is input to the FSM.

The controllable skew may be configured to offset a systematic skew between respective clocks input to the first and second programmable delay elements. The systematic skew may be due to clock distribution differences of the first and second clock distribution circuits.

The DLL may further comprise a first internal fixed delay element configured to delay the first clock and output the first clock delayed; a second internal fixed delay element configured to delay the second clock and output the second clock delayed; a PDL configured to generate a PDL output as a function of the first clock and the second clock delayed; and a PDR configured to generate a PDR output as a function of the second clock and the first clock delayed.

According to another example embodiment, a method for improving frequency of a chip may comprise outputting a first clock from a first programmable delay element of a delay-locked loop (DLL) on a chip to a first clock input of a phase detector of the DLL; outputting a second clock from a second programmable delay element of the DLL to a second clock input of the phase detector; and introducing a controllable skew between the first and second clocks by controlling respective programmable delays of the first and second programmable delay elements, in combination. The controllable skew may improve frequency of the chip.

Alternative method embodiments parallel those described above in connection with the example DLL embodiments.

It should be understood that example embodiments disclosed herein can be implemented in the form of a method, apparatus, system, or computer readable medium with program codes embodied thereon.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 1B is a signal timing diagram of an example embodiment of two clock signals with a controllable clock skew therebetween.

DETAILED DESCRIPTION

A description of example embodiments follows.

In delay-locked loop (DLL)-based clocking architectures, phase detectors are used to compare phase differences between two clocks. A phase-detector output may control a delay-line within a clock distribution. Using this feedback loop, a DLL may correct for static (e.g., intra-die variations, relative location of the phase-detector, etc.) and dynamic (e.g., dynamic IR drop, DVFS, di/dt drop, power-supply noise, etc.) skew between the two clocks. In many designs, chip frequency limiting paths typically exist between two clocks matched by DLLs. In such scenarios, having an option to add a systematic (useful) skew between the two clocks can help improve timing of critical paths at the expense of non-critical paths. A critical path is a path that violates timing most, relative to other paths. For example, the critical path may be the path(s) with longest delay(s). Such useful skew could potentially increase a frequency of chip; however, a conventional DLL architecture corrects for any skew (useful or otherwise) between the two clocks, indiscriminately.

According to an example embodiment of a DLL, a useful skew between the two clocks may be introduced in a manner such that the DLL is unable to correct (i.e., compensate) for the useful skew. According to an example embodiment, a DLL-based clocking architecture includes programmable delay at phase detector inputs. An example embodiment enables a programmable skew between two clocks for frequency improvement while the DLL is employed to correct for static skew (also referred to interchangeably herein as common-mode skew) and dynamic skew. As such programmable (i.e., controllable) skew is introduced at the inputs to the phase detector, the DLL is unable to correct for the programmable skew.

According to an example embodiment, Chip Select Register (CSR) or Joint Test Action Group (JTAG) controllable delay lines (also referred to interchangeably herein as programmable delay elements) may be added at the inputs of phase detectors to control skew at the input to the phase detector. In addition to post-silicon speed debug, the programmable delay elements at the phase detector inputs may also be used to augment a dynamic range of a main delay-line of a DLL by using the programmable delay elements to control the skew in order to offset any systematic skew between the clocks due to clock distribution differences.

Figure 1A:
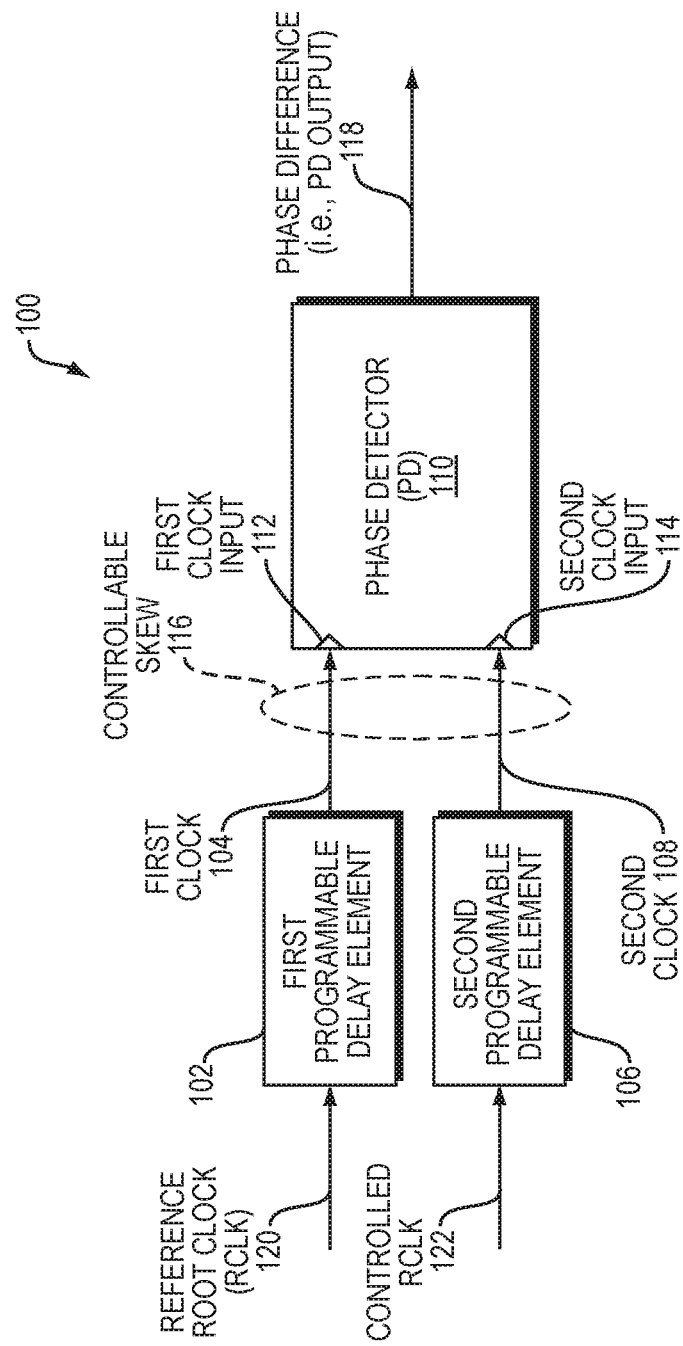
FIG. 1A is a block diagram of an example embodiment of a portion of a delay-locked loop (DLL) on a chip.

FIG. 1A is a block diagram of an example embodiment of a portion of a delay-locked loop (DLL) 100 on a chip (not shown). The DLL 100 comprises a first programmable delay element 102 configured to output a first clock 104, a second programmable delay element 106 configured to output a second clock 108, and a phase detector (PD) 110. The phase detector 110 may include a first clock input 112 and a second clock input 114. Such clock inputs may be pins or any other suitable interface that enables the phase detector 110 to receive a clock signal via the clock input. The first programmable delay element 102 and second programmable delay element 106 may be further configured, in combination, to introduce a controllable skew 116 between the first clock 104 and second clock 108. The DLL 100 may be configured to input the first clock 104 and second clock 108 to the first clock input 112 and second clock input 114 of the phase detector 110, respectively. The controllable skew 116 may be configured to improve frequency of the chip. The controllable skew 116 may introduce a positive skew or a negative skew between the first clock 104 and second clock 108 relative to the first clock 104 or the second clock 108.

FIG. 1B is a signal timing diagram of an example embodiment of two clock signals (also referred to interchangeably herein as clocks) with the controllable clock skew 116 therebetween. The two clock signals include the first clock 104 and second clock 108 of the DLL 100 of FIG. 1A, disclosed above. The first clock 104 and the second clock 108 are output from the first programmable delay element 102 and the second programmable delay element 106 of the DLL 100. Delay of such first and second programmable delay elements may be programmed such that the first clock 104 and second clock 108 are skewed, that is, respective rising and falling edges of the first clock 104 and second clock 108 are not aligned.

It should be understood that the controllable skew 116 may configured to be a negative skew in which the first clock 104 lags the second clock 108, such as disclosed in FIG. 1B, or may be a positive skew in which the first clock 104 leads the second clock 108. It should be understood that a frequency of the first clock 104 and second clock 108 and the controllable skew 116 in the signal timing diagram are for illustrative purpose and the any suitable frequency may be employed with such the first clock 104 and the second clock 108 at a same frequency.

Turning back to FIG. 1A, according to an example embodiment, the controllable skew 116 is introduced by configuring respective delays of the first programmable delay element 102 and the second programmable delay element 106 and is a skew for which the DLL 100 cannot compensate. As the controllable skew 116 may be configured to improve frequency of the chip and, possibly, to maximize the frequency of the chip, the controllable skew 116 may referred to interchangeably herein as a "useful" skew as such skew improves timing of the chip and benefits the chip.

Configuring the respective delays may include programming the first programmable delay element 102 and second programmable delay element 106, dynamically or statically. For example, a CSR may be employed to program such respective delays and the CSR may be controlled, dynamically, via software. Alternatively, fuses may be configured such that a value(s) of the CSR are configured to be static. Configuring such respective delays, either statically or dynamically may be performed in any suitable manner under software control, hardware control, or a combination thereof.

According to an example embodiment, the chip may include at least one critical path (not shown) and at least one non-critical path (not shown). A critical path may be a path that violates timing the most, relative to timing of other paths. For example, the critical path may be the path(s) with longest delay(s) relative to delays of other paths. The controllable skew 116 may be configured to improve frequency of the chip by reducing latency of the at least one critical path and increasing latency of the at least one non-critical path.

According to an example embodiment, a first path in a first direction between two clock grids on the chip may be deemed as a critical path and a second path in second direction between the two clock grids may be deemed as a non-critical path, wherein the first direction is opposite to the second direction. Programming delays of the first programmable delay element 102 and second programmable delay element 106 provides an option to add a systematic (useful) skew between the two clocks and can help improve timing of critical paths at the expense of non-critical paths.

According to an example embodiment, the first programmable delay element 102 and second programmable delay element 106 are programmable delay lines. The first programmable delay element 102 and second programmable delay element 106 may be any suitable delay elements capable of inserting an electrical delay in a path of a signal, wherein the electrical delay that is inserted is changeable, for example, by adjusting an analog voltage or digital control value, or in any other suitable manner.

Respective programmable delays of the first programmable delay element 102 and second programmable delay element 106 may be configured to be programmed via control signals (not shown) generated external to the DLL 100. For example, the first programmable delay element 102 and second programmable delay element 106 may be Joint Test Action Group (JTAG) enabled and may include respective JTAG interfaces (not shown). Respective programmable delays of the first programmable delay element 102 and second programmable delay element 106 may be configured to be programmed via the respective JTAG interfaces.

Alternatively, respective programmable delays of the first programmable delay element 102 and second programmable delay element 106 may be configured to be programmed via at least one Chip Select Register (CSR) (not shown) of the chip. The at least one CSR may be a single CSR with multiple fields for setting respective delay values for controlling respective delays of the first programmable delay element 102 and second programmable delay element 106. Alternatively, the at least one CSR may include multiple CSRs wherein the respectively delays for the first programmable delay element 102 and second programmable delay element 106 are stored in a first CSR and a second CSR, respectively.

The phase detector 110 (also referred to interchangeably herein as the PD 110) is configured to compare respective phases of the first clock 104 and second clock 108 and to generate a phase difference 118 (also referred to interchangeably herein as the PD output 118) based on the respective phases compared. The phase difference 118, that is, the PD output 118, provides feedback to control a delay-line (not shown). Using such feedback, that is, the PD output 118, the DLL 100 corrects for static skew, such as skew introduced by intra-die variations, relative location of the phase-detector, etc., between the two clocks, as well as dynamic skew, such as skew due to dynamic IR drop, dynamic voltage and frequency scaling (DVFS), di/dt drop, power-supply noise, etc., between a reference root clock (RCLK) 120 and a controlled RCLK 122 as disclosed below, with regard to FIG. 2.

Figure 2:
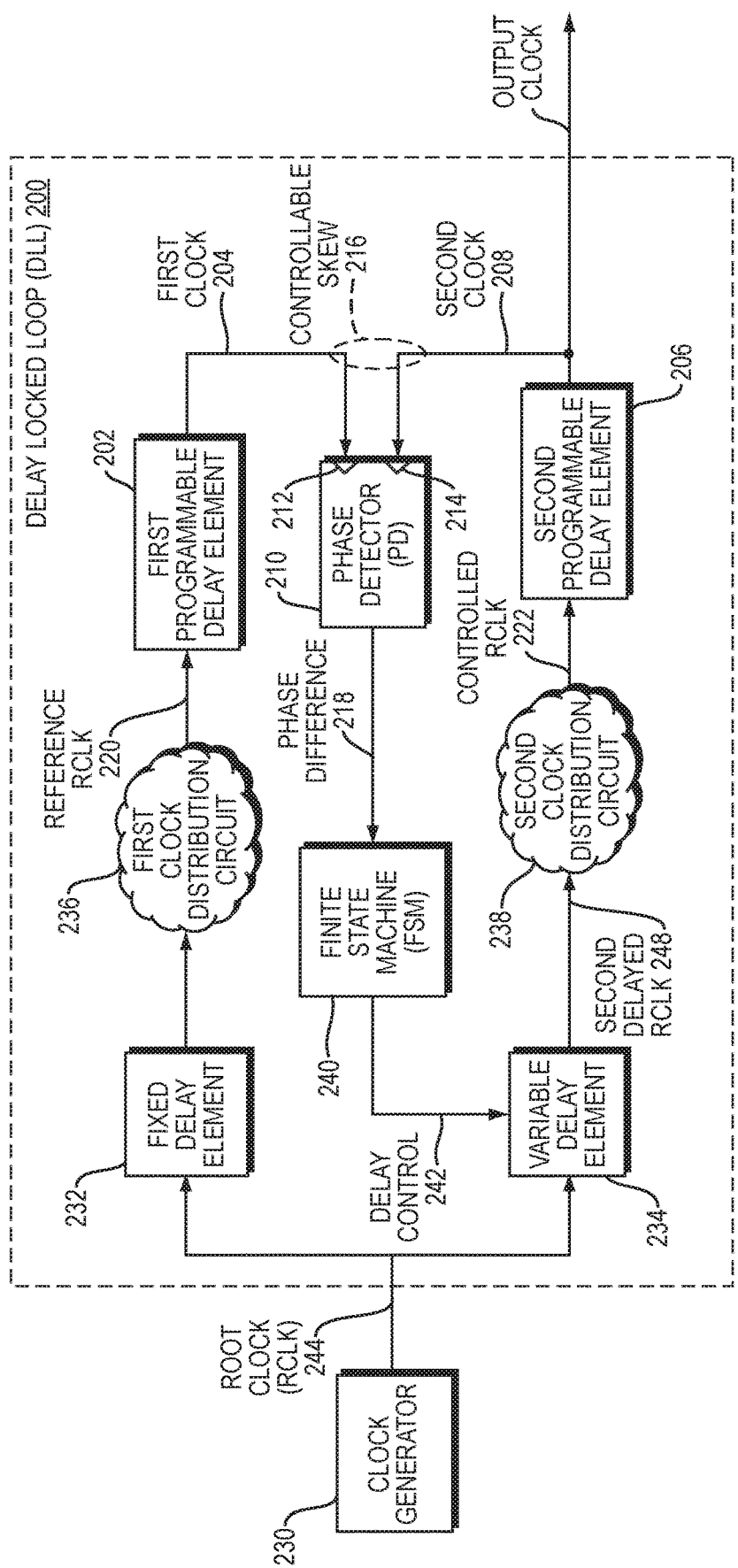
FIG. 2 is a block diagram of an example embodiment of a DLL and a clock generator.

FIG. 2 is a block diagram of an example embodiment of a DLL 200 on a chip (not shown) and a clock generator 230. The clock generator 230 may be on the chip or external to the chip. The clock generator 230 is configured to source the RCLK 120 to the DLL 200. The RCLK 120 may be a phase-locked clock signal. Such clock generator 230 may be any suitable clock generator that is configured to source the phase-locked clock signal. For example, the clock generator 230 may include at least one phase-locked loop (PLL) to source the phase-locked clock signal. The clock generator 230 may include multiple phase-locked loops (PLLs), enabling the clock generator 230 to change frequency of the RCLK 120 by changing a selection of a PLL from among the multiple PLLs for outputting the RCLK 120.

The DLL 200 comprises a first programmable delay element 202 configured to output a first clock 204, a second programmable delay element 206 configured to output a second clock 208 (i.e., output clock), and a phase detector (PD) 210. The phase detector 210 includes a first clock input 212 and a second clock input 214. The first programmable delay element 202 and second programmable delay element 206 may be further configured, in combination, to introduce a controllable skew 216 between the first clock 204 and second clock 208. The DLL 200 may be configured to input the first clock 204 and second clock 208 to the first clock input 212 and second clock input 214 of the phase detector 210, respectively. The controllable skew 216 may be configured to improve frequency of the chip.

The DLL 200 further comprises a fixed delay element 232; a variable delay element 234; a first clock distribution circuit 236 interposed between the fixed delay element 232 and the first programmable delay element 202; a second clock distribution circuit 238 interposed between the variable delay element 234 and the second programmable delay element 206; and a finite state machine (FSM) 240.

The fixed delay element 232 and variable delay element 234 may be delay lines wherein the fixed delay element 232 has a fixed delay and the variable delay element 234 has a variable delay. The variable delay of the variable delay element 234 may be an analog voltage controlled variable delay. Alternatively, such variable delay may be controlled, digitally.

The phase detector 210 is configured to compare respective phases of the first clock 204 and the second clock 208 and to generate a phase difference 218 based on the respective phases compared. The phase difference 218 provides feedback to control the variable delay element 234. Specifically, the FSM 240 is configured to generate the delay control 242 based on the phase difference 218. The variable delay of the variable delay element 234 is configured via the delay control 242.

The DLL 200 is coupled to the clock generator 230. The clock generator 230 is configured to output a root clock (RCLK) 244 to the fixed delay element 232 and variable delay element 234. The fixed delay element 232 is configured to output a first delayed RCLK 246 to the first clock distribution circuit 236. The first clock distribution circuit 236 is configured to output a reference RCLK 220 to the first programmable delay element 202. The variable delay element 234 is configured to output a second delayed RCLK 248 to the second clock distribution circuit 238 as a function of the delay control 242. The second distribution circuit 238 is configured to output a controlled RCLK 222 to the second programmable delay element 206.

Using the feedback, that is, the phase difference 218 (i.e., PD output), the DLL 200 corrects for static skew, such as skew introduced by intra-die variations, relative location of the phase-detector, etc., between the two clocks, as well as dynamic skew, such as skew due to dynamic IR drop, dynamic voltage and frequency scaling (DVFS), di/dt drop, power-supply noise, etc., between the reference RCLK 220 and the controlled RCLK 222. The DLL 220 is unable, however, to compensate for the controllable skew 216 as such skew is introduced again in the feedback loop, that is, introduced at the inputs to the phase detector 210 via the first programmable delay element 202 and second programmable delay element.

According to an example embodiment, clock distribution on the chip may be separated into various clock grids and the reference RCLK 220 and the controlled RCLK 222 are from separate clock grids on the chip. The controllable clock skew 216 may provide a control for changing timing of at least one path on the chip that traverses between clock grids of the chip.

The first programmable delay element 202 and second programmable delay element 206 may be further configured, in combination, to introduce the controllable skew 216 to offset a systematic skew (not shown) between the reference RCLK 220 and the controlled RCLK 222. The systematic skew may be due to clock distribution differences of the first clock distribution circuit 236 and second clock distribution circuit 238. The first clock distribution circuit 236 and second clock distribution circuit 238 may be any suitable clock distribution circuits, such as a clock tree, or any other suitable clock distribution circuits.

The first programmable delay element 202 and second programmable delay element 206 may enable post-silicon speed debug. For example, as respective delays of the first programmable delay element 202 and second programmable delay element 206 may be configured post-silicon, that is, after manufacture of the chip, such respective delays may be changed, post-silicon, enabling values thereof to be determined wherein such determined values improve frequency of the chip. According to an example embodiment, such values may then be set such that the respective delays are configured to be static prior to deployment of the chip in the field. According to an example embodiment, at least one falling phase detector (PDL) and at least one rising phase detector (PDR) may be included in the DLL architecture for use in such post-silicon debug, as disclosed below with regard to FIG. 3.

Figure 3:
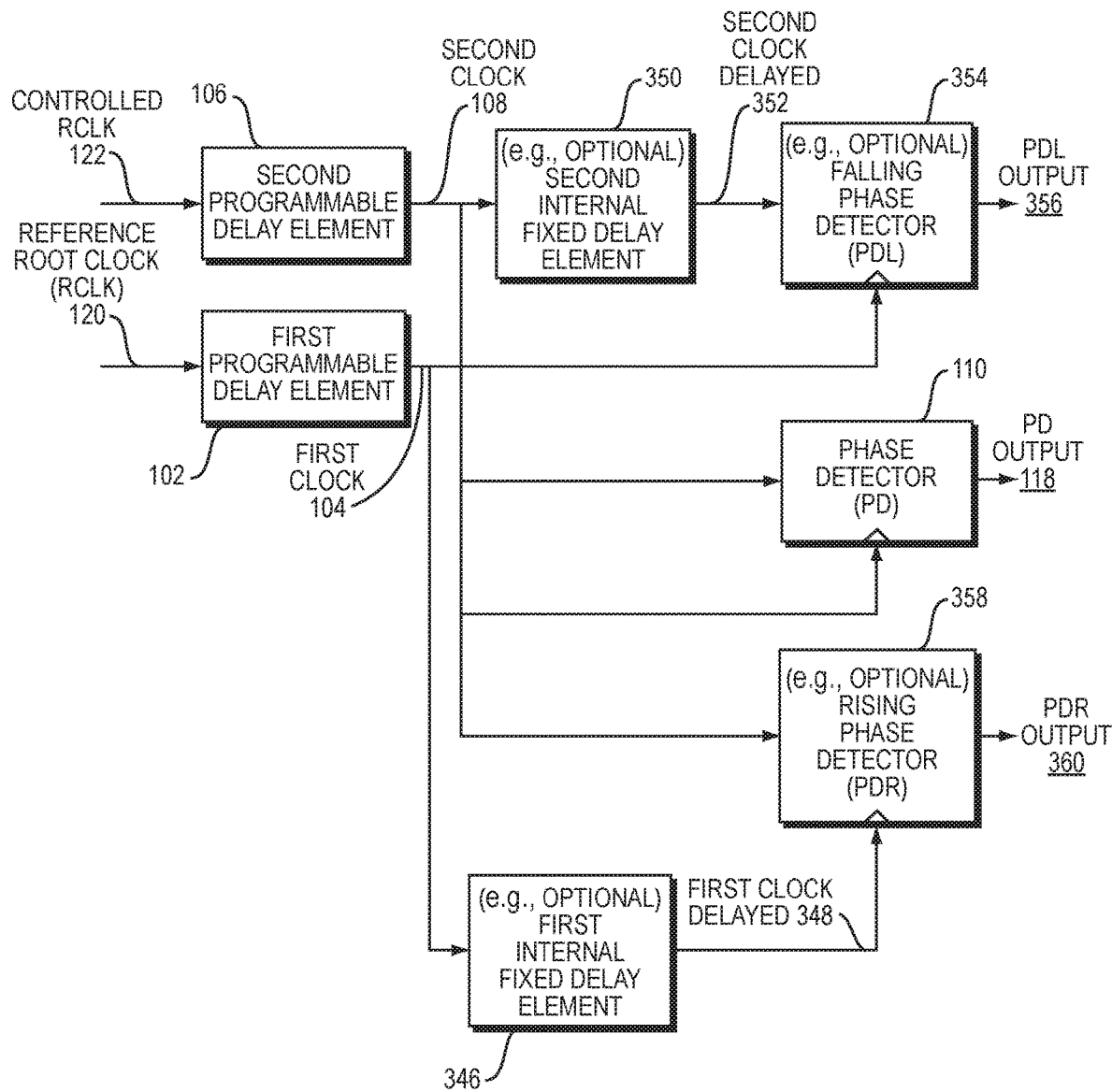
FIG. 3 is a block diagram of the portion of the DLL of FIG. 1A with optional elements.

FIG. 3 is a block diagram of the portion of the DLL 100 of FIG. 1A with optional elements. Such optional elements include a first internal fixed delay element 346, second internal fixed delay element 350, falling phase detector (PDL) 354, and rising phase detector (PDR) 358. Such optional elements may be employed, for example, for post-silicon debug to validate respective delay values of the first programmable delay element 102 and second programmable delay element 106.

In the example embodiment, the first internal fixed delay element 346 is configured to delay the first clock 104 and output the first clock delayed 348. The second internal fixed delay element 350 is configured to delay the second clock 108 and output the second clock delayed 352. The PDL 354 is configured to generate a PDL output 356 as a function of the first clock 104 and the second clock delayed 352. The PDR 358 is configured to generate a PDR output 360 as a function of the second clock 108 and the first clock delayed 348. In the example embodiment, the controlled RCLK 122 is matched to the reference RCLK 120 using the DLL 100 and the PDL/PDR phase-detectors, that is, the PDL 354 and the PDR 358 provide outputs, that is, the PDL output 356 and the PDR output 358 that may be input to an FSM, such as the FSM 440 of the DLL 400 disclosed below with regard to FIG. 4, and provide debug information. Such optional elements may be employed in the architecture of the DLL 200 of FIG. 2 as disclosed below with regard to FIG. 4.

Figure 4:
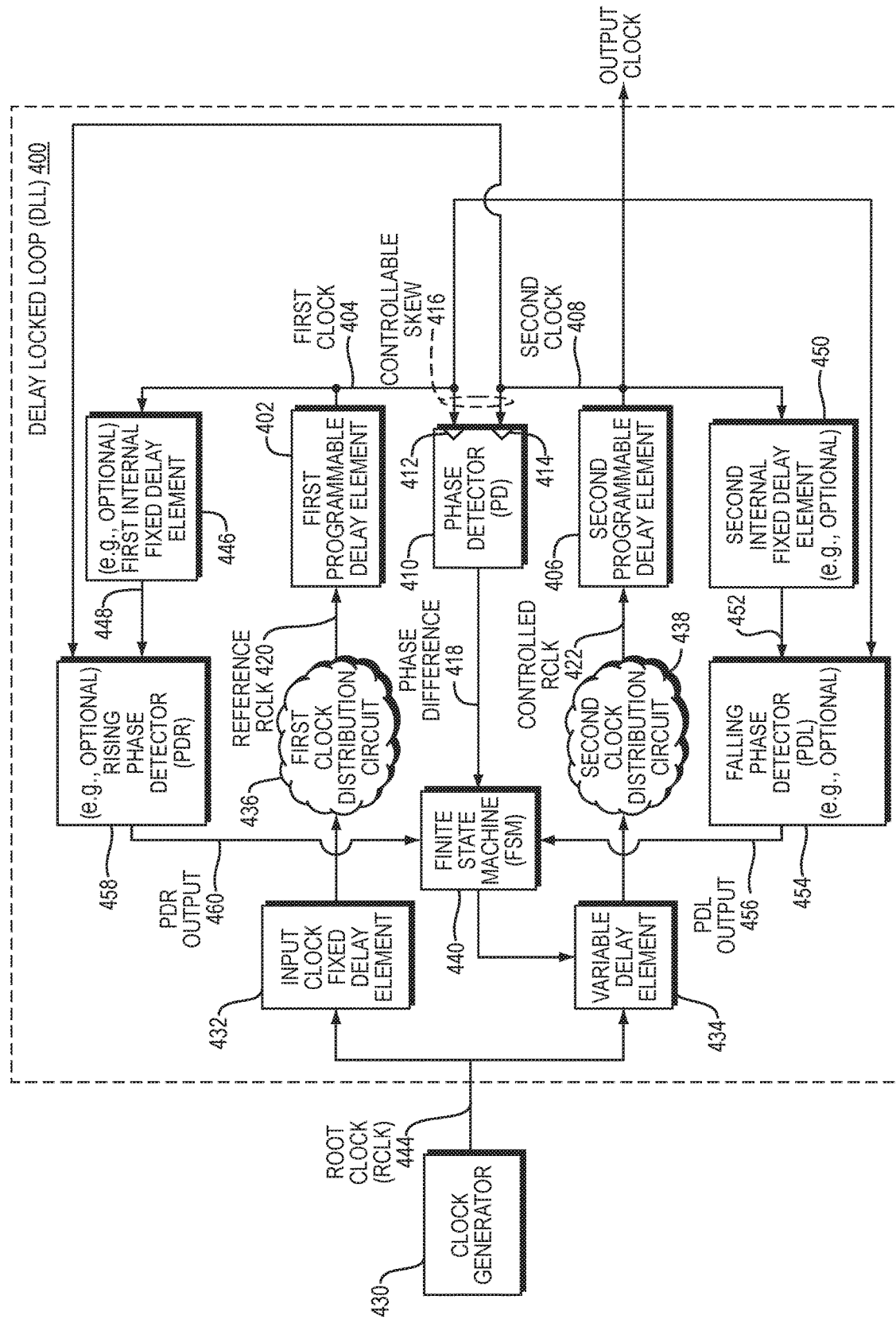
FIG. 4 is a block diagram of an example embodiment of a DLL with the optional elements of FIG. 3 and a clock generator.

FIG. 4 is a block diagram of an example embodiment of a DLL 400 and a clock generator 430. The DLL 400 has the architecture of the DLL 200 of FIG. 2 with the optional elements disclosed above with regard to FIG. 3.

The DLL 400 comprises a first programmable delay element 402 configured to output a first clock 404, a second programmable delay element 406 configured to output a second clock 408 (i.e., output clock), and a phase detector (PD) 410. The phase detector 410 includes a first clock input 412 and a second clock input 414. The first programmable delay element 402 and second programmable delay element 406 may be further configured, in combination, to introduce a controllable skew 416 between the first clock 204 and second clock 408. The DLL 400 may be configured to input the first clock 404 and second clock 408 to the first clock input 412 and second clock input 414 of the phase detector 410, respectively. The controllable skew 416 may be configured to improve frequency of the chip.

The DLL 400 further comprises a variable delay element 434; a first clock distribution circuit 436 interposed between the input clock fixed delay element 432 and the first programmable delay element 402; a second clock distribution circuit 438 interposed between the variable delay element 434 and the second programmable delay element 406; and a finite state machine (FSM) 440.

The phase detector 410 is configured to compare respective phases of the first clock 412 and the second clock 408 and to generate a phase difference 418 based on the respective phases compared. The phase difference 418, that is, the PD output, provides feedback to control the variable delay element 434. Specifically, the FSM 440 is configured to generate the delay control 442 based on the phase difference 418. A variable delay of the variable delay element 434 is configured via the delay control 442.

The DLL 400 is coupled to the clock generator 430. The clock generator 430 is configured to output a root clock (RCLK) 444 to the input clock fixed delay element 432 and variable delay element 434. The input clock fixed delay element 432 is configured to output a first delayed RCLK 446 to the first clock distribution circuit 436. The first clock distribution circuit 436 is configured to output a reference RCLK 420 to the first programmable delay element 402. The variable delay element 434 is configured to output a second delayed RCLK 448 to the second clock distribution circuit 438 as a function of the delay control 442. The second distribution circuit 438 is configured to output a controlled RCLK 422 to the second programmable delay element 406.

Using the feedback, that is, the phase difference 418 (i.e., PD output), the DLL 400 corrects for static skew, such as skew introduced by intra-die variations, relative location of the phase-detector, etc., between the two clocks, as well as dynamic skew, such as skew due to dynamic IR drop, dynamic voltage and frequency scaling (DVFS), di/dt drop, power-supply noise, etc., between the reference RCLK 420 and the controlled RCLK 422.

The first programmable delay element 402 and second programmable delay element 406 may be further configured, in combination, to introduce the controllable skew 416 to offset a systematic skew (not shown) between the reference RCLK 420 and the controlled RCLK 422. The systematic skew may be due to clock distribution differences of the first clock distribution circuit 436 and second clock distribution circuit 438.

The DLL 400 further comprises optional elements, namely, a first internal fixed delay element 446, second internal fixed delay element 450, falling phase detector (PDL) 454, and rising phase detector (PDR) 458 that may be employed to provide debug information to the FSM 440.

The first internal fixed delay element 446 is configured to delay the first clock 404 and output the first clock delayed 448. The second internal fixed delay element 450 is configured to delay the second clock 408 and output the second clock delayed 452. The PDL 454 is configured to generate a PDL output 456 as a function of the first clock 404 and the second clock delayed 452. The PDR 458 is configured to generate a PDR output 460 as a function of the second clock 408 and the first clock delayed 448.

The PDL output 456 and PDR output 460 are input to the FSM 440 and may provide debug information. The PDL output 456 and PDR output 460 may be binary values configured to signify whether lock of the DLL is on a falling edge or rising edge, respectively.

Figure 5:
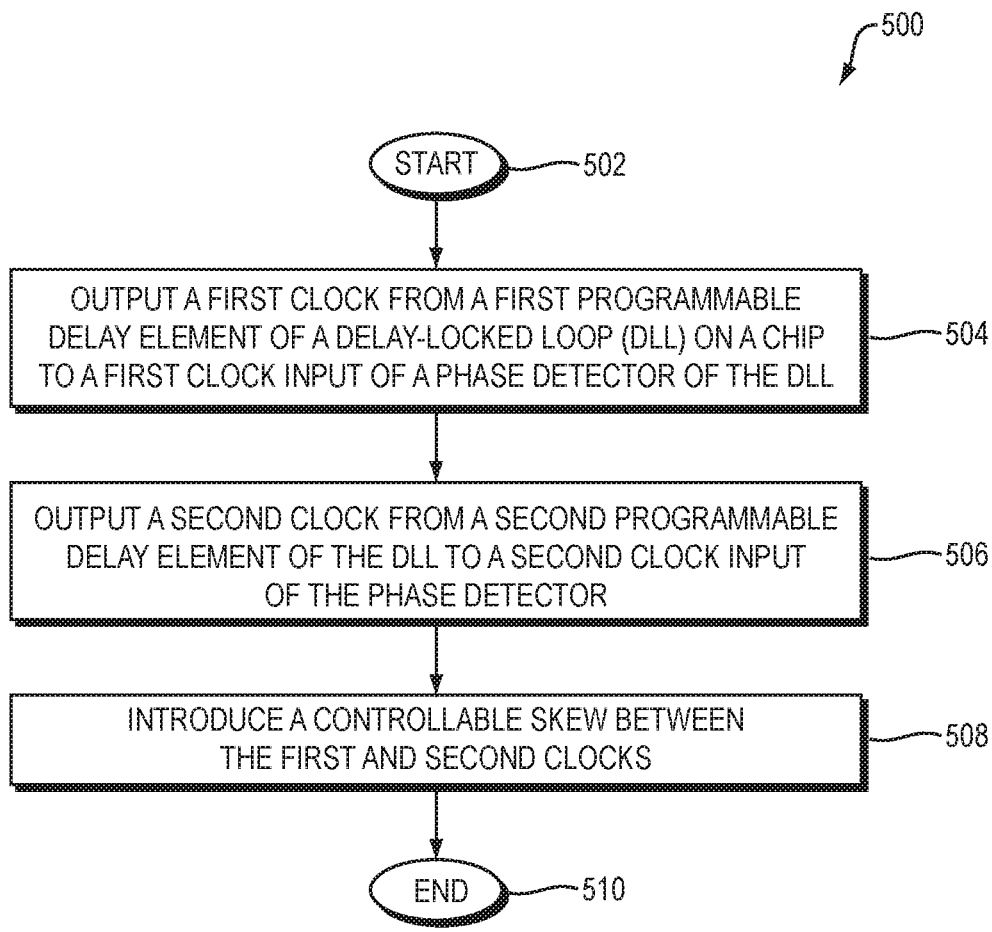
FIG. 5 is a flow diagram of an example embodiment of a method for improving frequency of a chip.

FIG. 5 is a flow diagram 500 of an example embodiment of a method for improving frequency of a chip. The method begins (502) and outputs a first clock from a first programmable delay element of a delay-locked loop (DLL) on a chip to a first clock input of a phase detector of the DLL (504). The method outputs a second clock from a second programmable delay element of the DLL to a second clock input of the phase detector (506). The method introduces a controllable skew between the first and second clocks by controlling respective programmable delays of the first and second programmable delay elements, in combination, the controllable skew improving frequency of the chip (508), and the method thereafter ends (510) in the example embodiment.

The chip may include at least one critical path and at least one non-critical path. The introducing may reduce latency of the at least one critical path and increase latency of the at least one non-critical path to improve the frequency The method may further comprise configuring the respective programmable delays of the first and second programmable delay elements via control signals generated external to the DLL.

The first and second programmable delay elements may be Joint Test Action Group (JTAG) enabled and may include respective JTAG interfaces. The method may further comprise configuring the respective programmable delays of the first and second programmable delay elements via the respective JTAG interfaces.

The method may further comprise configuring the respective programmable delays of the first and second programmable delay elements via at least one Chip Select Register (CSR) of the chip.

The method may further comprise comparing respective phases of the first and second clocks and generating a phase difference based on the comparing; generating a delay control based on the phase difference; and controlling a variable delay via the delay control.

The DLL may include a first clock distribution circuit and a second clock distribution circuit and the method may further comprise offsetting a systematic skew between respective clocks input to the first and second programmable delay elements via the controllable skew. The systematic skew may be due to clock distribution differences of the first and second clock distribution circuits.

The DLL may include a falling phase detector (PDL) and a rising phase detector (PDR) and the method may further comprise: delaying the first clock and outputting the first clock delayed; delaying the second clock and outputting the second clock delayed; generating a PDL output from the PDL as a function of the first clock and the second clock delayed; and generating a PDR output from the PDR as a function of the second clock and the first clock delayed.

Further example embodiments disclosed herein may be configured using a computer program product; for example, controls may be programmed in software for implementing example embodiments. Further example embodiments may include a non-transitory computer-readable medium containing instructions that may be executed by a processor, and, when loaded and executed, cause the processor to complete methods described herein. It should be understood that elements of the block and flow diagrams may be implemented in software or hardware, firmware, a combination thereof, or other similar implementation determined in the future. In addition, the elements of the block and flow diagrams described herein may be combined or divided in any manner in software, hardware, or firmware. If implemented in software, the software may be written in any language that can support the example embodiments disclosed herein. The software may be stored in any form of computer readable medium, such as random-access memory (RAM), read only memory (ROM), compact disk read-only memory (CD-ROM), and so forth. In operation, a general purpose or application-specific processor or processing core loads and executes software in a manner well understood in the art. It should be understood further that the block and flow diagrams may include more or fewer elements, be arranged or oriented differently, or be represented differently. It should be understood that implementation may dictate the block, flow, and/or network diagrams and the number of block and flow diagrams illustrating the execution of embodiments disclosed herein. Further, example embodiments and elements thereof may be combined in a manner not explicitly disclosed herein.

While example embodiments have been particularly shown and described, it will be understood by those skilled in the art that various changes in form and details may be made therein without departing from the scope of the embodiments encompassed by the appended claims.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A delay-locked loop (DLL) on a chip, the DLL comprising:
   a first programmable delay element configured to output a first clock;
   a second programmable delay element configured to output a second clock; and
   a phase detector including a first clock input and a second clock input, the first and second programmable delay elements further configured, in combination, to introduce a controllable skew between the first and second clocks, the DLL configured to input the first and second clocks to the first and second clock inputs of the phase detector, respectively, the DLL unable to compensate for the controllable skew introduced by the first and second programmable delay elements.

2. The DLL of claim 1, wherein the chip includes at least one critical path and at least one non-critical path and wherein the controllable skew is configured to improve frequency of the chip by reducing latency of the at least one critical path and increasing latency of the at least one non-critical path.

3. The DLL of claim 1, wherein respective programmable delays of the first and second programmable delay elements are configured to be programmed via control signals generated external to the DLL.

4. The DLL of claim 1, wherein:
   the first and second programmable delay elements are Joint Test Action Group (JTAG) enabled and include respective JTAG interfaces; and
   respective programmable delays of the first and second programmable delay elements are configured to be programmed via the respective JTAG interfaces.

5. The DLL of claim 1, wherein respective programmable delays of the first and second programmable delay elements are configured to be programmed via at least one Chip Select Register (CSR) of the chip.

6. The DLL of claim 1, wherein the phase detector is configured to compare respective phases of the first and second clocks and to generate a phase difference based on the respective phases compared and wherein the DLL further comprises:
   a fixed delay element;
   a variable delay element;
   a first clock distribution circuit interposed between the fixed delay element and the first programmable delay element;
   a second clock distribution circuit interposed between the variable delay element and the second programmable delay element; and
   a finite state machine (FSM) configured to generate a delay control based on the phase difference, a variable delay of the variable delay element configured via the delay control.

7. The DLL of claim 6, wherein:
   the DLL is coupled to a clock generator, the clock generator configured to output a root clock (RCLK) to the fixed and variable delay elements;
   the fixed delay element is configured to output a first delayed RCLK to the first clock distribution circuit, the first clock distribution circuit configured to output a reference RCLK to the first programmable delay element; and
   the variable delay element is configured to output a second delayed RCLK to the second clock distribution circuit as a function of the delay control, the second distribution circuit configured to output a controlled RCLK to the second programmable delay element.

8. The DLL of claim 7, wherein the first and second programmable delay elements are further configured, in combination, to introduce the controllable skew to offset a systematic skew between the reference RCLK and the controlled RCLK, the systematic skew due to clock distribution differences of the first and second clock distribution circuits.

9. The DLL of claim 7, wherein the fixed delay element is an input clock fixed delay element and wherein the DLL further comprises:
   a first internal fixed delay element configured to delay the first clock and output the first clock delayed;
   a second internal fixed delay element configured to delay the second clock and output the second clock delayed;
   a falling phase detector (PDL) configured to generate a PDL output as a function of the first clock and the second clock delayed, wherein the PDL output is input to the FSM; and
   a rising phase detector (PDR) configured to generate a PDR output as a function of the second clock and the first clock delayed, wherein the PDR output is input to the FSM.

10. The DLL of claim 1, wherein the DLL further comprises a first clock distribution circuit and a second clock distribution circuit, wherein the controllable skew is configured to offset a systematic skew between respective clocks input to the first and second programmable delay elements, the systematic skew due to clock distribution differences of the first and second clock distribution circuits.

11. The DLL of claim 1, wherein the DLL further comprises:
   a first internal fixed delay element configured to delay the first clock and output the first clock delayed;
   a second internal fixed delay element configured to delay the second clock and output the second clock delayed;
   a PDL configured to generate a PDL output as a function of the first clock and the second clock delayed; and
   a PDR configured to generate a PDR output as a function of the second clock and the first clock delayed.

12. A method for improving frequency of a chip, the method comprising:
   outputting a first clock from a first programmable delay element of a delay-locked loop (DLL) on a chip to a first clock input of a phase detector of the DLL;
   outputting a second clock from a second programmable delay element of the DLL to a second clock input of the phase detector; and
   introducing a controllable skew between the first and second clocks by controlling respective programmable delays of the first and second programmable delay elements, in combination, the DLL unable to compensate for the controllable skew introduced by the first and second programmable delay elements.

13. The method of claim 12, wherein the chip includes at least one critical path and at least one non-critical path and wherein the introducing reduces latency of the at least one critical path and increases latency of the at least one non-critical path to improve the frequency.

14. The method of claim 12, further comprising configuring the respective programmable delays of the first and second programmable delay elements via control signals generated external to the DLL.

15. The method of claim 12, wherein the first and second programmable delay elements are Joint Test Action Group (JTAG) enabled and include respective JTAG interfaces and wherein the method further comprises configuring the respective programmable delays of the first and second programmable delay elements via the respective JTAG interfaces.

16. The method of claim 12, wherein the method further comprises configuring the respective programmable delays of the first and second programmable delay elements via at least one Chip Select Register (CSR) of the chip.

17. The method of claim 12, further comprising:
   comparing respective phases of the first and second clocks and generating a phase difference based on the comparing;
   generating a delay control based on the phase difference; and
   and controlling a variable delay via the delay control.

18. The method of claim 12, wherein the DLL includes a first clock distribution circuit and a second clock distribution circuit and wherein the method further comprising:
   offsetting a systematic skew between respective clocks input to the first and second programmable delay elements via the controllable skew, the systematic skew due to clock distribution differences of the first and second clock distribution circuits.

19. The method of claim 12, wherein the DLL includes a falling phase detector (PDL) and a rising phase detector (PDR) and wherein the method further comprises:
   delaying the first clock and outputting the first clock delayed;
   delaying the second clock and outputting the second clock delayed;
   generating a PDL output from the PDL as a function of the first clock and the second clock delayed; and
   generating a PDR output from the PDR as a function of the second clock and the first clock delayed.

20. A delay-locked loop (DLL) on a chip, the DLL comprising:
   a first programmable delay element configured to output a first clock;
   a second programmable delay element configured to output a second clock; and
   a phase detector including a first clock input and a second clock input, the first and second programmable delay elements further configured, in combination, to introduce a controllable skew between the first and second clocks, the DLL configured to input the first and second clocks to the first and second clock inputs of the phase detector, respectively, the controllable skew introduced to increase frequency of the chip, the DLL unable to compensate for the controllable skew introduced by the first and second programmable delay elements.

* * * * *